United States Patent [19]

Okada et al.

[11] Patent Number: 4,700,464
[45] Date of Patent: Oct. 20, 1987

[54] METHOD OF FORMING TRENCH ISOLATION IN AN INTEGRATED CIRCUIT

[75] Inventors: Daisuke Okada; Akihisa Uchida; Toshihiko Takakura; Shinji Nakashima, all of Koganei; Nobuhiko Ohno, Tokorozawa; Katsumi Ogiue, Hinode, all of Japan

[73] Assignees: Hitachi, Ltd.; Hitachi Microcomputer Engineering, Ltd., both of Tokyo, Japan

[21] Appl. No.: 661,116

[22] Filed: Oct. 15, 1984

[30] Foreign Application Priority Data

Oct. 14, 1983 [JP] Japan .................................. 58-190779

[51] Int. Cl.[4] ..................... H01L 21/22; H01L 21/302
[52] U.S. Cl. ....................................................... 437/67
[58] Field of Search ..................... 29/571, 578, 576 B, 29/576 W, 589; 148/1.5, DIG. 85, DIG. 86; 357/47, 49, 54, 55; 156/643, 644

[56] References Cited

U.S. PATENT DOCUMENTS

| | | | |
|---|---|---|---|
| 3,969,168 | 7/1976 | Kuhn | 29/576 W X |
| 4,353,086 | 10/1982 | Jaccodine et al. | 29/576 W X |
| 4,396,460 | 8/1983 | Tamaki et al. | 156/653 |
| 4,528,047 | 7/1985 | Beyer et al. | 357/49 X |
| 4,538,343 | 9/1985 | Pollack et al. | 29/576 W |

FOREIGN PATENT DOCUMENTS 0020994 1/1981 European Pat. Off. .
0084465 7/1983 European Pat. Off. .
0200575 11/1983 Japan ............................... 29/576 W

OTHER PUBLICATIONS

Takemoto et al., "A Vertically Isolated Self Aligned Transistor-VIST", IEEE Trans. Elec. Devices, vol. ED-29, No. 11, Nov. 1982, pp. 1761-1765.
Antipov, "Prevention of Birdsbeak Formation", IBM Tech. Disc. Bull., vol. 23, No. 11, Apr. 1981, pp. 4917-4919.

*Primary Examiner*—Brian E. Hearn
*Assistant Examiner*—Tom Thomas
*Attorney, Agent, or Firm*—Antonelli, Terry & Wands

[57] ABSTRACT

A semiconductor integrated circuit device is provided with polycrystalline silicon filling U-grooves etched in a semiconductor substrate to form isolation regions which prevent any short-circuiting between the polycrystalline silicon and electrodes or wiring formed on the semiconductor substrate. A silicon dioxide film is formed within the U-grooves, and a silicon nitride film and a silicon dioxide film are further formed thereon. The silicon nitride film has a high hardness which suppresses the development of crystal defects in the peripheral active regions due to the expansion of the surface of the polycrystalline silicon when it is oxidized. When the surface of the polycrystalline silicon is oxidized, the oxidation proceeds along the oxide film over the nitride film, so that the whole of the oxide film is formed thickly. Therefore, the silicon nitride film and the silicon dioxide film are provided with an increased margin against the etching used for forming contact holes.

20 Claims, 15 Drawing Figures

METHOD OF FORMING TRENCH ISOLATION IN AN INTEGRATED CIRCUIT

BACKGROUND OF THE INVENTION

The present invention relates to semiconductor techniques, and particularly to a technique of isolating elements which can be effectively utilized for the formation of element-isolating regions in a semiconductor integrated circuit device, for example.

Elements in a seminconductor integrated circuit device are conventionally isolated by a pn junction isolation method using diffusion layers, or by an oxidation film isolation method utilizing a local oxidation film formed over the surface of the substrate. With these isolation methods, however, the widths of the isolation regions are relatively wide, so that as the elements become smaller, the isolation regions occupy a proportionally larger area. This makes it difficult to increase the density of LSI devices. The applicants have therefore proposed an isolation technique called the U-groove isolation method whereby portions that act as isolation regions between the active regions of elements are cut to form U-shaped grooves (like a moat or trench, hereinafter referred to as U-grooves). A silicon dioxide film is formed within the U-grooves which are then filled with polycrystalline silicon. This forms element-isolating regions.

According to this U-groove isolation method, the surfaces of the polycrystalline silicon filling each U-groove must be thermally oxidized to form a silicon dioxide film. This prevents short-circuiting between the polycrystalline silicon in the U-grooves and the wiring formed on the surface of the substrate, or the electrodes formed in the vicinity of the wiring.

However, the oxidation of the surface of polycrystalline silicon in the U-shaped grooves results in an increase in volume, and stresses are generated which expand the openings of the U-grooves. These stresses distort the boundaries between each U-groove isolation region and the semiconductor region. Therefore, dislocations develop in the monocrystalline silicon and spread through the crystal to destroy the pn junctions of the elements.

For that reason, the applicants have developed the technique described below. As shown in FIG. 1, a silicon nitride film (Si3N4 film) of a high hardness is formed over the inner surface of a silicon dioxide film 3 formed within a U-shaped isolation groove 2 provided in the surface of a semiconductor substrate 1. When a silicon dioxide film 6 is formed over the surface of polycrystalline silicon 5 filling the U-groove 2, the silicon nitride film 4, of high hardness, absorbs the stresses produced by the expansion of the silicon dioxide film 6. This prevents the transmission of stress to the outer silicon crystal, and prevents the development of dislocations.

This technique has been disclosed in, for example, the journal "NIKKEI ELECTRONICS", March 29, 1982, No. 287, pp. 90–101.

SUMMARY OF THE INVENTION

When manufacturing a semiconductor integrated circuit device using this technique, the inventors have discovered that the following problem occurs.

With the silicon nitride film 4 formed over the silicon dioxide film 3 within the U-groove 2, when the surface of the polycrystalline silicon 5 is oxidized, the growth rate of the parts of the silicon dioxide film in contact with the silicon nitride film 4 is smaller than that of the central part of the silicon dioxide film. Therefore, when a silicon nitride film 4a on the surface of the substrate 1 is subjected to etching in a subsequent step, the thickness of the silicon dioxide film 6 on the boundaries of the U-groove 2 becomes extremely small, as shown in FIG. 1. Consequently, short-circuiting can easily occur between the polycrystalline silicon 5 in the U-shaped groove and an electrode formed on the surface of the substrate in the vicinity of the U-groove. A mask for forming an electrode such as an emitter electrode must be formed so that a margin for mask alignment remains about the U-groove. This, however, reduces the density of integration of the circuit.

On the other hand, it is difficult to provide sufficient etching of the silicon nitride film 4 or the silicon dioxide film 6, if short-circuiting is prevented in this way.

For these reasons, the provision of the silicon nitride film 4 makes it difficult to maintain electrical insulation between the electrode or wiring and the polycrystalline silicon in the U-groove; i.e., it makes it difficult to increase the degree of integration, or flatten the surface of the substrate.

When dealing with a semiconductor integrated circuit device by adapting this isolation method based on grooves, the object of the present invention is to prevent short-circuiting between electrodes or wiring formed on the surface of the substrate and a semiconductor material formed in a groove thereof, and control the development of crystal defects caused by the formation of isolation regions based upon grooves.

Another object of the present invention is to increase the degree of integration of a semiconductor integrated circuit device which uses this isolation method based on grooves.

A further object of the present invention is to enable the flattening of the surface of the substrate after isolation regions have been formed by grooves.

A further object of the present invention is to provide a semiconductor substrate having isolation based on grooves, and a method of providing such substrate.

These and other objects as well as novel features of the present invention will become apparent from the following description in the specification and the accompanying drawings.

A representative example of the inventions disclosed in this specification is described below briefly.

A silicon nitride film is formed within a groove between regions in which elements will be formed, and a silicon dioxide film is then formed over the silicon nitride film. The silicon nitride film suppresses the development of crystal defects in the surrounding semiconductor region that result from the expansion of the surface of the polycrystalline silicon when it is oxidized in the grooves. When oxidizing the surface of the polycrystalline silicon, the oxidation proceeds along the silicon dioxide film, so that the whole of the silicon dioxide film is formed thickly. This helps to increase the margin of the silicon nitride film or silicon dioxide film for etching. Preferably, an initial silicon dioxide film is formed within the groove prior to formation of the silicon nitride film, so that the silicon nitride film is formed on the initial silicon dioxide film.

DESCRIPTION OF THE PREFERRED EMBODIMENT

Figure 1:
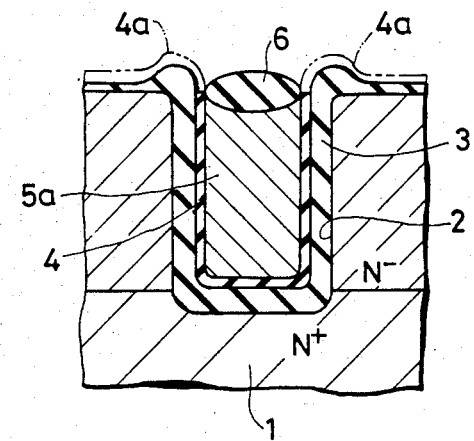
FIG. 1 is a section through the structure of a U-groove.

FIGS. 2 to 15 illustrate the sequence of manufacturing an embodiment in which the present invention is adapted to a bipolar type of semiconductor integrated circuit device in which the elements are isolated by the U-groove isolation method.

In this embodiment, a semiconductor body 10 (having a thickness, e.g.. of 250 μm) is first prepared by the same process as that used for producing an ordinary bipolar type of integrated circuit device. Holes for the construction of buried layers are formed at suitable positions in a silicon dioxide film that is formed on the main surface of a semiconductor substrate 1 of p-type monocrystalline silicon. Using the silicon dioxide film as a mask, the substrate 1 is heavily doped with n-type impurities to form a local n+-type buried layer 11 (of a thickness of, e.g., 2 μm). After the silicon dioxide film is removed, and n−-type epitaxial layer 12 (of a thickness of, e.g., 1.4 μm) is grown on the substrate 1 by a vapor growth method. This provides the semiconductor body 10.

A silicon dioxide film (SiO2) 14 (e.g.,1000 Angstrom thick) and a silicon nitride film (Si3N4)15 (e.g., 2400 Angstrom thick) are formed on the main surface of the semiconductor body 10 by thermal oxidation and CVD, respectively. The silicon nitride film 15 and the silicon dioxide film 14 are removed by selective etching from portions at which isolation regions will be formed, i.e., they are removed from the periphery of bipolar transistors and the boundaries between base regions and collector contact regions.

Figure 2:
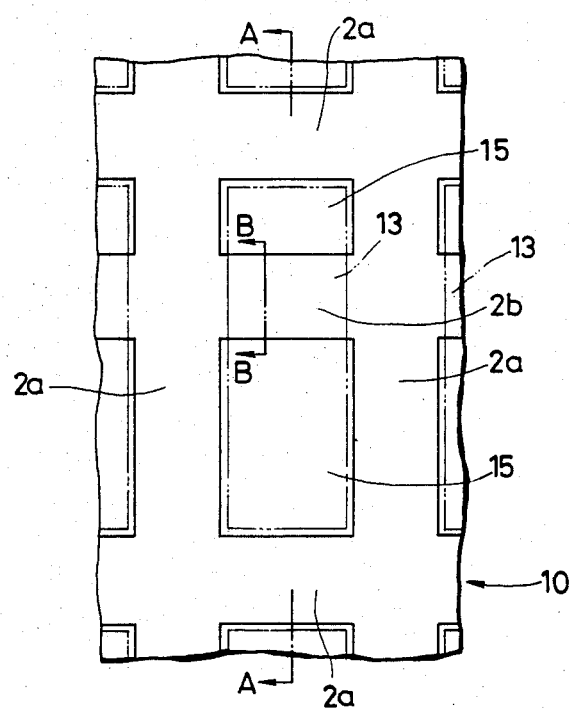
FIG. 2 is a plan view of U-grooves formed in a semiconductor substrate.
Figure 3:
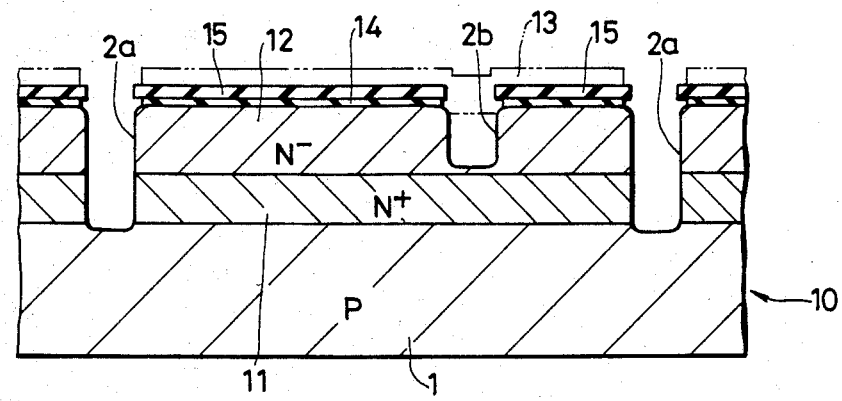
FIG. 3 is a section through the device of FIG. 2.

Using the silicon nitride film 15 as a main mask, the semiconductor body 10 is etched to form U-grooves 2a, 2b, such grooves respectively having widths of, e.g., 3.5 μm and 3 μm. This is shown in FIGS. 2 and 3. FIG. 3 is a section taken along the line A—A of FIG. 2. The silicon dioxide film 14 is not shown in FIG. 2.

First, using the silicon nitride film 15 as a mask, the surface of the semiconductor body 10 is etched selectively and shallowly (e.g., 0.6 μm depth) by anisotropic etching using hydrazine. The anisotropic etching of the semiconductor body is performed for tapering the edge of the groove. In accordance with the tapering, stresses applied to the edge are reduced to a lower level. With respect to such etching, if the main surface of the substrate 1 (or epitaxial layer 12) has (100) crystal plane, the plane at the tapering surface after the etching would correspond, for example, to the (111) crystal plane. A photoresist film 13 is then formed so as to cover at least boundary portions between base regions and collector contact regions. Initial dry etching (to a depth of 2.5 μm, for example) is done using the silicon nitride film 15 and the photoresist film 13 as masks. This makes it possible to form a relatively shallow U-groove 2a around the periphery of each bipolar transistor. The photoresist film 13 is removed, and a second dry etching step (to a further depth of 0.8 μm, for example) is done. This ensures that a relatively shallow U-groove 2b (of a depth of about 0.8 μm, for example) is formed in each boundary portion between the base regions and the collector contact regions, and the U-groove 2a is deepened around the peripheral portion thereof. The U-grooves 2a are formed so that they extend as far as the p-type substrate 1, through the n+-type buried layer 11, and the U-grooves 2b are formed as far as a point just before the n+-type buried layer 11.

The U-groove isolation regions are then formed according to steps shown in FIGS. 4 to 8, which are sections taken along the line B—B of FIG. 2. Although FIGS. 4 to 8 only show a U-groove 2b, the U-grooves 2a are formed by exactly the same steps.

Figure 4:
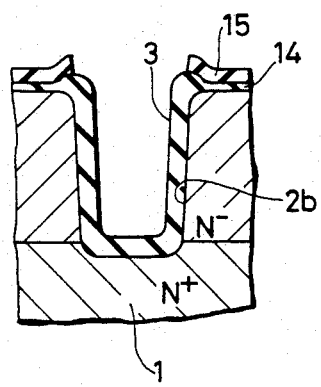
FIGS. 4 to 8 are partial sections on an enlarged scale of steps of filling the U-groove of FIG. 3.
Figure 5:
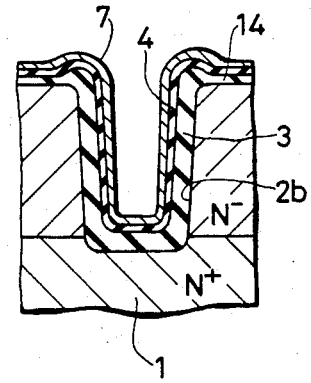

Using the silicon nitride film 15 as a mask, the exposed semiconductor body is thermally oxidized so that a silicon dioxide film 3 (of a thickness of e.g.,4000 Angstrom) is formed within each U-groove 2b, as shown in FIG. 4. As can be seen in FIG. 4, such thermal oxidation provides the silicon dioxide film to extend into n+-type buried layer 11. The silicon dioxide film 3 is provided for reducing a parasitic capacitance between the element-forming regions. The material of this film 3 may be changed to another insulating material such as SiO2 produced by chemical vapor deposition, phosphosilicate glass (PSG), or boron-silicate glass (BSG), which is deposited on the surface of the groove. However, in using any of these other materials, the film is deposited also on the main surface of the semiconductor body with the same thickness as on the groove. As a result, selective etching of the film becomes difficult. Accordingly, it is desirable that the film 3 be formed by selective thermal oxidation of the body.

After the silicon nitride film 15 is removed, a silicon nitride film 4 (of a thichkness of, e.g., 500 Angstrom) is formed over the silicon dioxide film 3 by a CVD Method, and then a thin polycrystalline silicon layer 7 (thickness of 500 Angstrom, for example) is formed over the silicon nitride film 4 by CVD.

The polycrystalline silicon layer 7 is thermally oxidized to provide a silicon dioxide film (SiO2 film) 7a (of about 1000 Angstrom thickness, for example).

According to this method, the silicon dioxide film 7a can be formed thickly, and the film thickness can be easily controlled.

Instead of the thermally-oxidized film 7a, a silicon dioxide film formed by CVD can be used. However, if such silicon dioxide film formed by CVD is used, the thickness of such film should be greater than that of thermally-oxidized film 7a in view of the greater etching speed of CVD-formed silicon oxide as compared with that of the thermally-oxidized film. After contact holes for connecting the emitter and base regions to their electrodes have been etched, a thermally-oxidized film should preferably be formed to maintain a good electric insulation between each electrode and the polycrystalline silicon.

Figure 6:
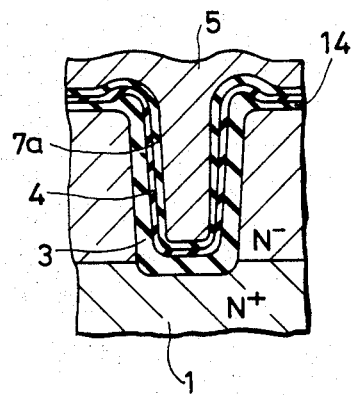

As shown in FIG. 6, the polycrystalline silicon 5 is deposited thickly over the whole surface of the semiconductor body 10 so as to fill the grooves covered with the silicon dioxide film 7a.

Figure 7:
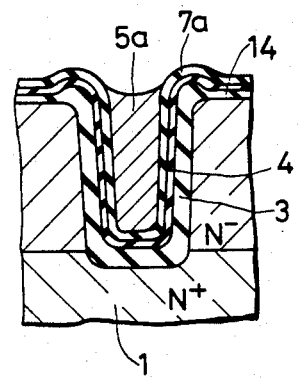

The surface of the polycrystalline silicon 5 is removed by dry etching, leaving polycrystalline silicon 5a in the U-grooves 2a and 2b, as shown in FIG. 7.

Figure 8:
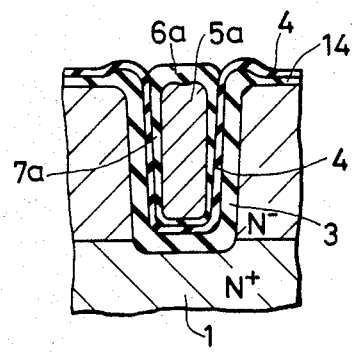

The silicon dioxide film 7a exposed on the surfaces other than those of the U-grooves 2a, 2b is removed by wet etching, and the surfaces of the polycrystalline silicon 5a in the U-grooves 2a, 2b are thermally oxidized to form silicon dioxide film 6a. Such silicon dioxide film 6a has a thickness, e.g., greater than the thickness of the silicon dioxide film 7a. As an example, this film 6a has a thickness of 4000 Angstrom at the center and 5000–6000 Angstrom at the "bird's beaks". Since the silicon dioxide film 7a is formed within the U-grooves, the oxidation proceeds along the silicon dioxide film 7a using the same mechanism as the development of "bird's beaks". As shown in FIG. 8, therefore, both edges of the silicon dioxide film 6a near the surface have a larger thickness than those of FIG. 1. The silicon dioxide film 7a over the regions other than those of the U-grooves 2a, 2b may be removed after the silicon dioxide film 6a has been formed, rather than before as described previously.

The silicon nitride film 4 exposed on the surfaces other than those of the U-grooves is removed by etching. N-type impurities such as phosphorus ions are then heavily diffused or implanted into the surface of portions at which collector contact regions will be formed, and p-type impurities such as boron ions are implanted in the surface of portions at which base regions will be formed.

Figure 9:
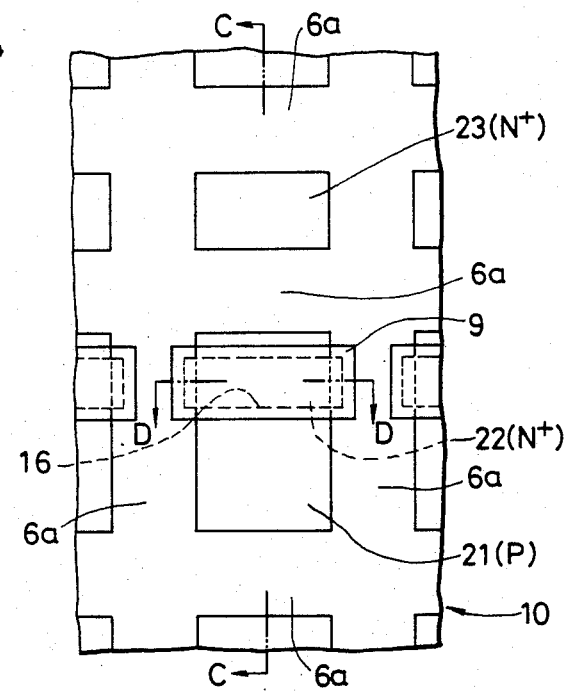
FIG. 9 is a plan view showing how emitter electrodes are formed.
Figure 10:
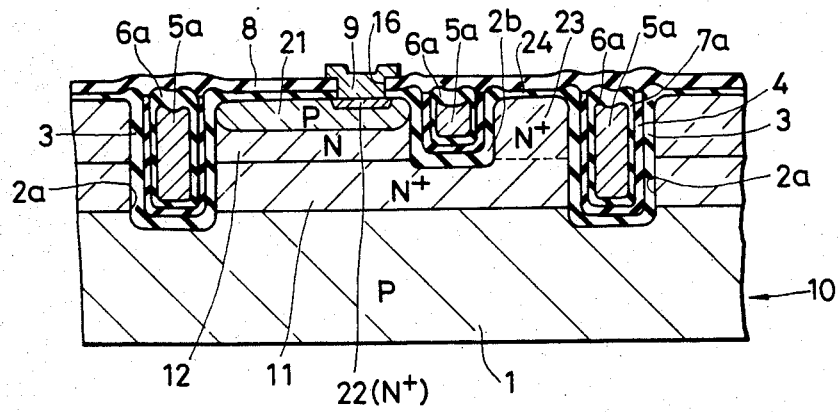
FIGS. 10 and 11 are sections through the device of FIG. 9.
Figure 11:
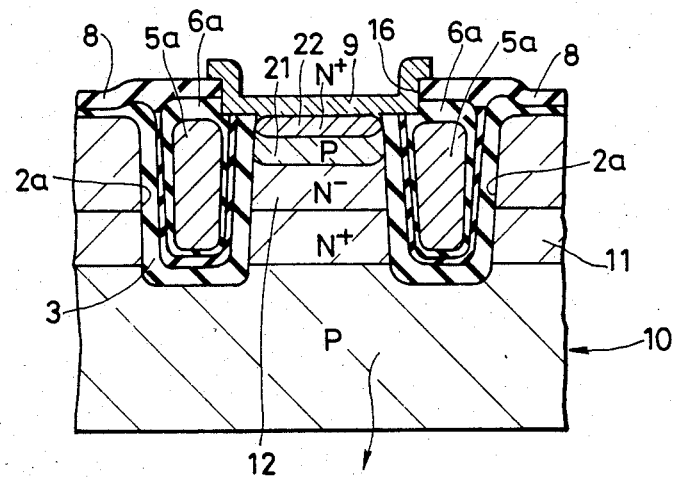

Emitter regions and emitter electrodes of polycrystalline silicon are then formed, as shown in FIGS. 9, 10 and 11. FIGS. 10 and 11 are sections taken along the line C—C and the line D—D, respectively, of FIG. 9. FIG. 9 does not show any insulation films 24 and 8. FIG. 10 is the cross section of only one bipolar transistor, it does not show any other bipolar transistors. This is also true for FIGS. 11, 13, 14 and 15.

A silicon dioxide film 24 and a silicon nitride film 8 are newly formed over the whole surface of the semiconductor body 10 by a CVD method. A PSG (phosphosilicate glass) film may be formed instead of the silicon nitride film 8. The silicon dioxide film 24 and the silicon nitride film 8 are selectively removed from the portion at which the emitter region will be formed, so that a hole 16 is formed for the emitter region. A polychrstalline silicon electrode 8 is formed on the surface of the portion at which the emitter region will be formed, so that the emitter region will be shallow. N-type impurities such as arsenic ions are implanted into the polycrystalline silicon electrode 9. The impurities are then thermally diffused simultaneously with a heat treatment which forms a p+-type semiconductor region 21 that acts as the base region, an n+-type semiconductor region 22 that acts as the emitter region, and an n+-type semiconductor region 23 that acts as the collector contact region. As can be appreciated, conventional processing techniques can be used for forming these regions.

According to this embodiment as shown in FIG. 11, two edges of the n+-type emitter region 22 are brought into contact with U-groove isolation regions (hereinafter, this is referred to as a walled emitter). The walled emitter is suitable for increasing the degree of integration since it eliminates the need of a margin for mask alignment between the isolation region and the hole 16 for the emitter region. According to this embodiment, short-circuiting can be prevented between the polycrystalline silicon electrode 9 and the polycrystalline silicon 5a in the U-shaped grooves, even if a walled emitter is employed.

When a walled emitter is employed, the hole 16 must be formed so that it overlaps the isolation regions, as shown in FIGS. 9 and 11. Therefore, the silicon nitride film 4, silicon dioxide film 6 and silicon nitride film 8 over the isolation regions are etched. Accordingly, the emitter electrode 9 is also formed on the silicon dioxide film 6 of which the thickness is reduced by etching. Overetching must be done to completely remove the silicon nitride film 8 from the region where the emitter region will be formed, so that the silicon dioxide film 6 is inevitably subjected to the etching as well.

If the peripheral edge of the silicon dioxide film 6 is thin, as shown in FIG. 1, the polycrystalline silicon 6a and the polycrystalline silicon electrode 9 may short-circuit at the peripheral edge of the silicon dioxide film 6 in the step in which the silicon dioxide film 6 is etched. According to this embodiment, however, the oxide film 7a is formed within the U-groove, so that the peripheral portions of silicon dioxide film 6 have a sufficiently large thickness. This helps prevent shortcircuiting between the polycrystalline silicon electrode 9 and the polycrystalline silicon 5a. By employing this walled emitter structure, therefore, the dimensions of transistors can be reduced, the degree of integration of LSI devices can be increased, and the transistors can be operated at increased speeds.

Figure 12:
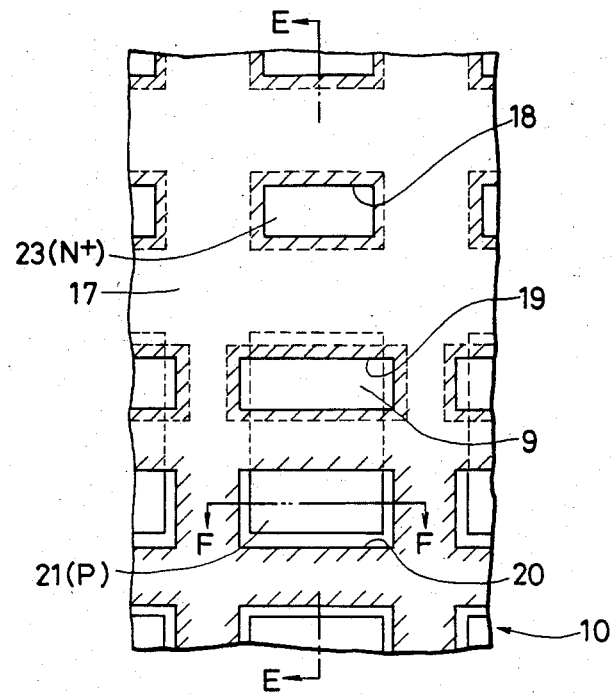
FIG. 12 is a plan view showing how contact holes are formed to connect aluminum wiring.
Figure 13:
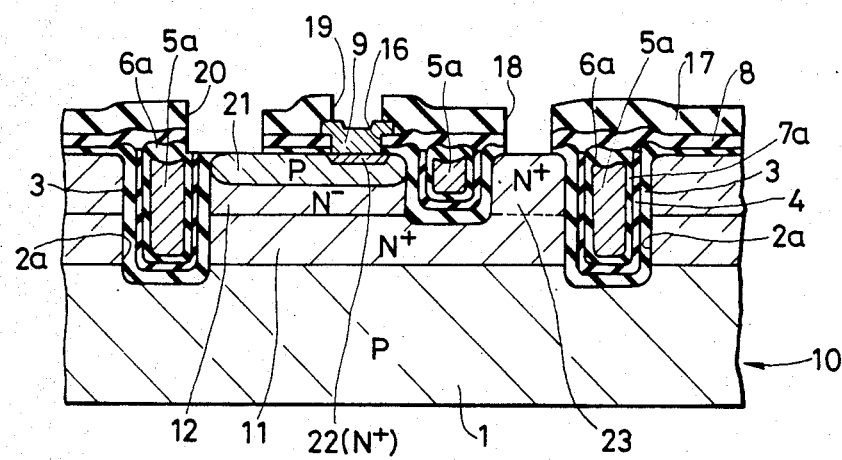
FIGS. 13 and 14 are sections through the device of FIG. 12.
Figure 14:
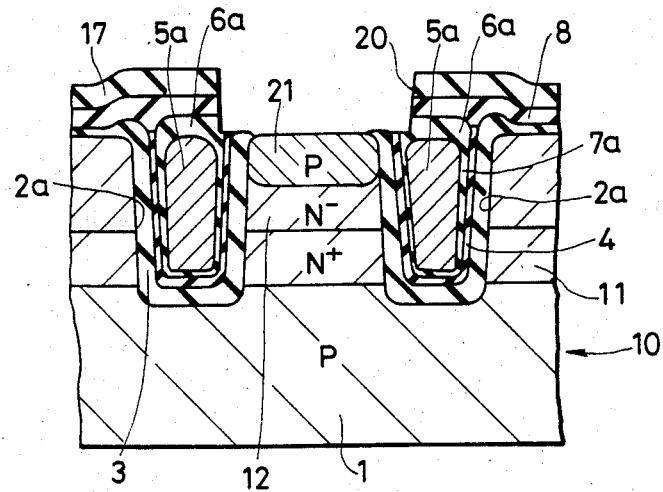

An intermediate insulation film 17 and contact holes 18, 19 and 20 are then formed, as shown in FIGS. 12, 13 and 14. FIGS. 13 and 14 are sections taken along the line E—E and the line F—F, respectively, of FIG. 12.

The intermediate insulation film 17, such as a PSG film, is first formed by a CVD method over the whole surface of the semiconductor body 10. Contact holes 18, 19 and 20 are then formed for the base, emitter and collector, using photoresist as a mask.

The contact hole 20 for the connection of aluminum wiring to the base region is formed so that it overlaps the isolation regions. No margin for mask alignment is required between the contact hole 20 and the isolation regions. Even if this margin for mask alignment is eliminated, to increase the degree of integration, short-circuiting between the polycrystalline silicon 5a in the U-grooves and the base electrode is prevented.

Figure 15:
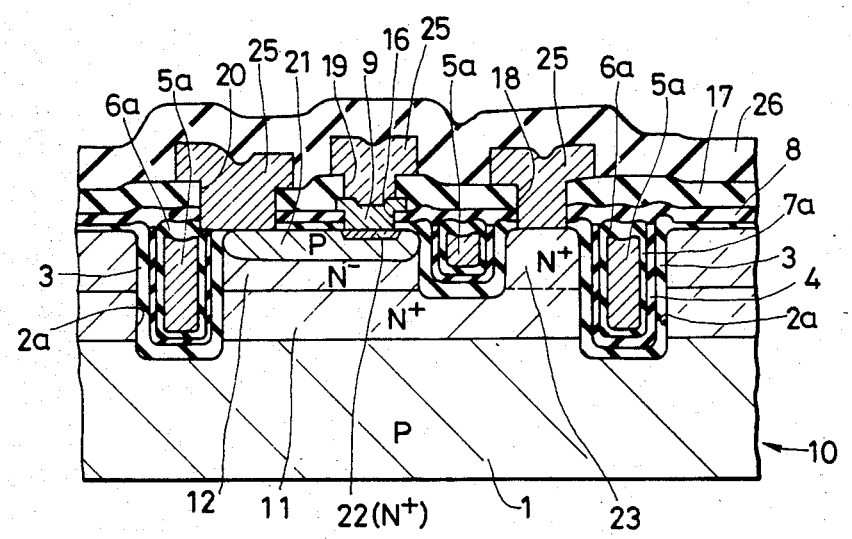
FIG. 15 is a section through a semiconductor integrated circuit, device according to the present invention.

Next, as shown in FIG. 15, a wiring material such as aluminum is deposited by evaporation over the whole surface of the semiconductor body 10, aluminum electrodes and aluminum wiring 25 are formed by photolithography, and a final passivation film 26 is formed thereon.

According to the present invention, in which the margin for mask alignment is eliminated to increase the degree of integration, short-circuiting between individual electrodes and the polycrystalline silicon in the U-grooves is prevented, and the production yield can be improved. The margin against overetching due to washing and etching of the silicon dioxide film 6 is also increased. According to this embodiment, the silicon nitride film 4 is barely etched in the step of removing the polycrystalline silicon 5, since the oxide film 7 has been formed on the surface of the silicon nitride film 4. Accordingly, the thickness of the silicon nitride film 4 can be reduced to such a degree that crystal defects (dislocations) will not develop. This means that overetching can be reduced when the silicon nitride film 4 is etched to flatten the surface; i.e., the surface can be flattened well.

As described above, U-grooves are formed in portions that will become isolation regions between regions in which elements are formed, a thermally-oxidized film is formed within each U-groove, and nitride film and an oxide film are further formed thereon.

The silicon nitride film of a high hardness suppresses the development of crystal defects in the peripheral regions due to the expansion of the surface of the polycrystalline silicon when it is oxidized in the U-grooves.

In this construction, furthermore, the oxidation proceeds along the silicon dioxide film formed on the inner surface of the silicon nitride film, when the surface of the polycrystalline silicon is oxidized. Therefore, a thick silicon dioxide film can be formed over the whole surface of the polycrystalline silicon in the U-grooves. This helps increase the margin of the silicon nitride film and the silicon dioxide film against etching. Accordingly, because of the walled emitter structure, short-circuiting is prevented between the polycrystalline silicon in the U-grooves and the polycrystalline silicon electrode formed between the emitter and the tops of the U-groove isolation regions.

According to this construction, furthermore, the silicon nitride film and the silicon oxide film have an increased margin for etching, and it is possible to provide overetching for the oxide film over the U-groove isolation regions. Consequently, the surface of the substrate can be easily flattened.

The present invention provided by the inventors was described specifically above with reference to an embodiment thereof. It must, however, be noted that the present invention is in no way limited to this embodiment alone, but can be modified in a variety of ways without departing from the spirit of the invention.

Thus, the film formed on the silicon nitride film in the grooves can be any appropriate insulating oxide such as PSG, BSG, or $SiO_2$ that is deposited by chemical vapor deposition, rather than, e.g., $SiO_2$ formed by thermal oxidation. This film formed on the silicon nitride, generally, is a material in which oxygen atoms are easily diffused. However, when this film is a material formed by procedures other than thermal oxidation, the distance between the edge of electrode 9 (FIG. 11) and the charged conductive material 5a is reduced to a small level since the etching speed or rate of each of the materials is relatively high as compared with that of the thermal oxide. Thus, in order to maintain desired distances, it is preferred that this film on the silicon nitride be formed by thermal oxidation.

Furthermore, other materials, such as aluminum, can be used instead of polycrystalline silicon to fill up the grooves. Such materials must be able to be thermally oxidized, to form an insulator; note the polycrystalline silicon 5a and thermally oxidized $SiO_2$ film 6a in FIG. 11.

This above-described embodiment dealt with the case in which the present invention was adapted to a semiconductor integrated circuit device in which elements were isolated by the U-groove isolation method. The present invention should not, however, be limited to the case in which elements are isolated by the U-groove isolation method. For instance, the invention can be adapted to any isolation technique in which grooves are formed and semiconductor material is deposited thereon to provide isolation regions, like a V-groove isolation method. Although polycrystalline silicon is usually used as a semiconductor material, any material can be used, provide that it has an electric conductivity (that is, is at least semiconducting) such that leakage currents can flow between elements to a degree that cannot be ignored.

The mask for etching the grooves may be a silicon dioxide film or a double-layer film obtained by forming a silicon dioxide film over the silicon nitride film 15.

The hole 16 for forming the emitter may be formed so that three edges thereof overlap element isolation regions. That is, in FIG. 9, the edge thereof opposite the collector contact region may also form a walled emitter structure.

The contact hole 20 can be formed so that it does not overlap the element isolation regions. That is, it can be formed in a region in which an element will be formed, like the contact hole 18 of FIG. 12. Conversely, the contact hole 18 may be formed in the same way as the contact hole 20 of FIG. 12. In order to increase the degree of integration, it is essential to employ this walled emitter structure.

The foregoing description has chiefly illustrated a bipolar type of integrated circuit device that was used as a background for the invention. The present invention, however, need not necessarily be limited thereto but may be adapted, for instance, to MOS integrated circuit devices. The degreee of integration can be increased by eliminating the margin for mask alignment between each contact hole for connecting an electrode to a source or drain region and the element isolation regions based upon the grooves. The invention can also be adapted to a semiconductor integrated circuit device of the type in which both bipolar transistors and MOSFETs are used. The invention can further be adapted to a semiconductor integrated circuit device of the type which has first isolation regions utilizing grooves and second isolation regions of any other structure. The second isolation regions may be thick oxide films (field oxide films) obtained, for instance, by the local oxidation of the main surface of the semiconductor body. As described above, the present invention can be effectively adapted to semiconductor integrated circuit devices of various types.

While we have shown and described only one embodiment in accordance with the present invention, it is understood that the same is not limited thereto but is susceptible of numerous changes and modifications as known to one having ordinary skill in the art and we therfore do not wish to be limited to the details shown and described herein, but intend to cover all such modifications as are encompassed by the scope of the appended claims.

We claim:

1. A process for forming isolation regions in a semiconductor body, comprising steps of:
    (a) forming grooves in a main surface of the semiconductor body;
    (b) forming an initial silicon dioxide film at least on the surfaces of said semiconductor body exposed within the grooves;
    (c) forming a silicon nitride film at least on the surfaces of the initial silicon dioxide film formed on the surfaces of said semiconductor body exposed within said grooves;
    (d) forming a first insulating film at least on said silicon nitride film in said grooves;
    (e) filling said grooves with a material that is at least semiconducting; and (f) forming a second insulating film so as to cover the surface of said material that is at least semiconducting, to thereby form said isolation regions.

2. A process for forming isolation regions according to claim 1, wherein said semiconductor body is made of silicon, and said initial silicon dioxide film is formed by thermally oxidizing the silicon exposed within the grooves.

3. A process for forming isolation regions according to claim 1, wherein the first and second insulating oxide films are first and second silicon dioxide films, respectively.

4. A process for forming isolation regions according to claim 3, wherein said material that is at least semiconducting is polycrystalline silicon.

5. A process for forming isolation regions according to claim 4, wherein said second silicon dioxide film is formed by thermally oxidizing said polycrystalline silicon.

6. A process for forming isolation regions according to claim 3, wherein the first silicon dioxide film is a silicon dioxide film formed by thermal oxidation.

7. A process for forming isolation regions according to claim 3, wherein, in the step of forming grooves, initially the main surface of the semiconductor body is etched by anisotropic etching so as to taper the edges of the grooves.

8. A process for forming isolation regions according to claim 3, wherein the second silicon dioxide film has a thickness greater than that of the first silicon dioxide film.

9. A process for forming isolation regions according to claim 3, wherein the second silicon dioxide film has edge portions adjacent the first silicon dioxide film and a central portion, and wherein the edge portions are thicker than the thickness of the central portion.

10. A process for forming isolation regions according to claim 3, wherein the grooves are formed by etching the semiconductor body at positions of the semiconductor body corresponding to locations of the isolation regions.

11. A process for forming isolation regions according to claim 3, wherein the first silicon dioxide film is formed by depositing a polycrystalline silicon film on said silicon nitride film and thermally oxidizing said polycrystalline silicon to form said first silicon dioxide film.

12. A process for forming isolation regions according to claim 1, wherein the second insulating oxide film is formed by thermal oxidation of the material that is at least semiconducting.

13. A process for forming isolation regions according to claim 12, wherein the first insulating oxide film is an oxide film formed by thermal oxidation.

14. A process of manufacturing a semiconductor integrated circuit device comprising:

(a) a step of forming grooves in one main surface of a semiconductor body by etching said semiconductor body;

(b) a step of forming an initial silicon dioxide film on the main surface of the semiconductor body and on the surfaces of said semiconductor body exposed within the grooves;

(c) a step of forming a silicon nitride film on said initial silicon dioxide film formed on the main surface of said semiconductor body and on the surfaces of said semiconductor body exposed within said grooves;

(d) a step of forming a first silicon dioxide film on said silicon nitride film;

(e) a step of filling said grooves with polycrystalline silicon;

(f) a step of forming a second silicon dioxide film so as to cover the surface of said polycrystalline silicon, by thermally oxidizing said polycrystalline silicon, to form isolation regions to define active regions in the semiconductor body; and (g) a step of forming semiconductor elements in said active regions.

15. A process of manufacturing a semiconductor integrated circuit device according to claim 14, wherein said first silicon dioxide film is formed by thermally oxidizing a polycrystalline silicon film that is formed on said silicon nitride film.

16. A process of manufacturing a semiconductor integrated circuit device according to claim 14, wherein said second silicon dioxide film is formed by thermally oxidizing said polycrystalline silicon using said silicon nitride film as a mask after said first silicon dioxide film has been removed from the portions other than within said grooves.

17. A process of manufacturing a semiconductor integrated circuit device according to claim 14, wherein the step of forming semiconductor elements in said active regions includes forming a semiconductor region in contact with the side walls of the grooves.

18. A process of manufacturing a semiconductor integrated circuit device according to claim 14, wherein the second silicon dioxide film has a thickness greater than that of the first silicon dioxide film.

19. A process of manufacturing a semiconductor integrated circuit device according to claim 14, wherein the second silicon dioxide film has edge portions adjacent the first silicon dioxide film and a central portion, and wherein the edge portions are thicker than the thickness of the central portion.

20. A process of manufacturing a semiconductor integrated circuit device according to claim 14, wherein said semiconductor body is made of silicon, and said initial silicon dioxide film is formed by thermally oxidizing the silicon exposed within the grooves.

* * * * *